US010659034B2

(12) United States Patent
Galy et al.

(10) Patent No.: US 10,659,034 B2
(45) Date of Patent: May 19, 2020

(54) INTEGRATED ELECTRONIC DEVICE SUITABLE FOR OPERATION IN VARIABLE-TEMPERATURE ENVIRONMENTS

(71) Applicant: STMicroelectronics SA, Montrouge (FR)

(72) Inventors: Philippe Galy, Le Touvet (FR); Renan Lethiecq, Bernin (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 16/429,544

(22) Filed: Jun. 3, 2019

(65) Prior Publication Data
US 2019/0372568 A1    Dec. 5, 2019

(30) Foreign Application Priority Data
Jun. 4, 2018    (FR) ...................................... 18 54829

(51) Int. Cl.
| H03K 17/687 | (2006.01) |
| H03K 17/14 | (2006.01) |
| H03K 3/356 | (2006.01) |
| H01L 27/12 | (2006.01) |

(52) U.S. Cl.
CPC ....... *H03K 17/145* (2013.01); *H01L 27/1203* (2013.01); *H03K 3/356017* (2013.01)

(58) Field of Classification Search
CPC ............. H03K 17/063; H03K 17/0822; H03K 17/04123; H03K 2217/0036; H03K 17/687; G01K 7/01; G01K 3/005; G01K 7/015; G05F 3/30; H01L 23/34

USPC ................................. 327/427, 434, 512, 513
See application file for complete search history.

(56) References Cited

U.S. PATENT DOCUMENTS

| 9,837,439 | B1 | 12/2017 | Faul | |
| 2005/0200398 | A1* | 9/2005 | Arai | H03K 17/0822 |
| | | | | 327/427 |
| 2013/0153900 | A1* | 6/2013 | Kinouchi | G01K 7/01 |
| | | | | 257/48 |
| 2013/0181693 | A1* | 7/2013 | Hayashi | H02H 11/003 |
| | | | | 323/311 |

OTHER PUBLICATIONS

INPI Search Report and Written Opinion for FR 1854829 dated Feb. 1, 2019 (8 pages).

* cited by examiner

*Primary Examiner* — Anh Q Tra
(74) *Attorney, Agent, or Firm* — Crowe & Dunlevy

(57) ABSTRACT

An integrated electronic device includes a silicon-on-insulator (SOI) substrate. At least one MOS transistor is formed in and on the SOI substrate. The at least one MOS transistor has a gate region receiving a control voltage, a back gate receiving an adjustment voltage, a source/drain region having a resistive portion, a first terminal coupled to a first voltage (e.g., a reference voltage) and formed in the source/drain region and on a first side of the resistive portion, and a second terminal generating a voltage representative of a temperature of the integrated electronic device, the second terminal being formed in the source/drain region and on a second side of the resistive portion. Adjustment circuitry generates the adjustment voltage as having a value dependent on the control voltage and on the voltage generated by the second terminal.

19 Claims, 2 Drawing Sheets

INTEGRATED ELECTRONIC DEVICE SUITABLE FOR OPERATION IN VARIABLE-TEMPERATURE ENVIRONMENTS

PRIORITY CLAIM

This application claims the priority benefit of French Application for Patent No. 1854829, filed on Jun. 4, 2018, the content of which is hereby incorporated by reference in its entirety to the maximum extent allowable by law.

TECHNICAL FIELD

Embodiments relate to integrated circuits, in particular integrated circuits suitable for operation in variable-temperature environments, and in particular to the management of the currents of such integrated circuits.

BACKGROUND

It is known that the operation of an integrated circuit may be affected by temperature variations. For example, the resistivity of the silicon increases with temperature, thereby potentially leading to a drop in the value of the current during operation.

Furthermore, an increase in the temperature may also increase the value of the leakage currents of the components, typically of the transistors, this being particularly problematic in the case of devices having a high number of components.

There is therefore a need to obtain a device in which the influence of the temperature on the operation of and on the leakage currents of the integrated circuit is reduced.

SUMMARY

According to one aspect, an integrated electronic device includes a substrate of silicon-on-insulator type and at least one MOS transistor formed in and on the substrate. The at least one MOS transistor includes a gate region configured to receive a control voltage, and a back gate configured to receive an adjustment voltage. A source region of the at least one MOS transistor includes a resistive portion. A first terminal configured to be linked to a reference voltage, for example ground, is located on a first side of the resistive portion, and a second terminal is formed on a second side of the resistive portion. The second terminal is configured to deliver a voltage whose value is representative of the temperature of the integrated electronic device.

The integrated electronic device includes adjustment circuitry that is configured to deliver, to the back gate, the adjustment voltage whose value depends on the value of the control voltage and on the value of the voltage delivered by the second terminal.

It is thus possible to modulate the value of the operating current of the at least one MOS transistor depending on the temperature of the integrated electronic device, thereby advantageously making it possible to avoid an excessively large variation in the operating current of the at least one MOS transistor or an excessively large increase in the leakage currents of the at least one MOS transistor.

The resistive portion may be surmounted by a line of gate material, the line being electrically isolated from the resistive portion by a dielectric material and extending from the gate region perpendicularly thereto while forming a continuity of material therewith. Biasing of the gate and of the back gate are therefore able to cause the resistance of the resistive portion vary.

It is thus advantageously possible to control the resistance of the resistive portion, in particular depending on the temperature of the integrated electronic device, thereby advantageously allowing enhanced control of the operating current and of the leakage currents of the at least one MOS transistor.

The control voltage may adopt a first value corresponding to an on state of the at least one MOS transistor, for example 1 volt, and a second value corresponding to an off state of the at least one MOS transistor, for example 0 volts. The adjustment circuitry is configured to deliver the adjustment voltage as having a first state, for example a positive state, on the back gate when the control voltage has the first value, and to deliver the control voltage as having a second state, for example a negative state, on the back gate when the control voltage has the second value, and to adjust the value of the adjustment voltage depending on the temperature of the integrated electronic device.

The adjustment circuitry may include a level shifter including an input coupled to the gate and an output, and an additional transistor coupled between the output of the level shifter and the back gate. The additional transistor has its gate coupled to the second terminal, and the output of the level shifter is configured to deliver a positive voltage if the voltage on the input is positive and a negative voltage if the voltage on the input is zero.

BRIEF DESCRIPTION OF THE DRAWINGS

Other advantages and features of will become apparent upon examining the detailed description of completely non-limiting embodiments and the appended drawings, in which.

DETAILED DESCRIPTION

Figure 2:
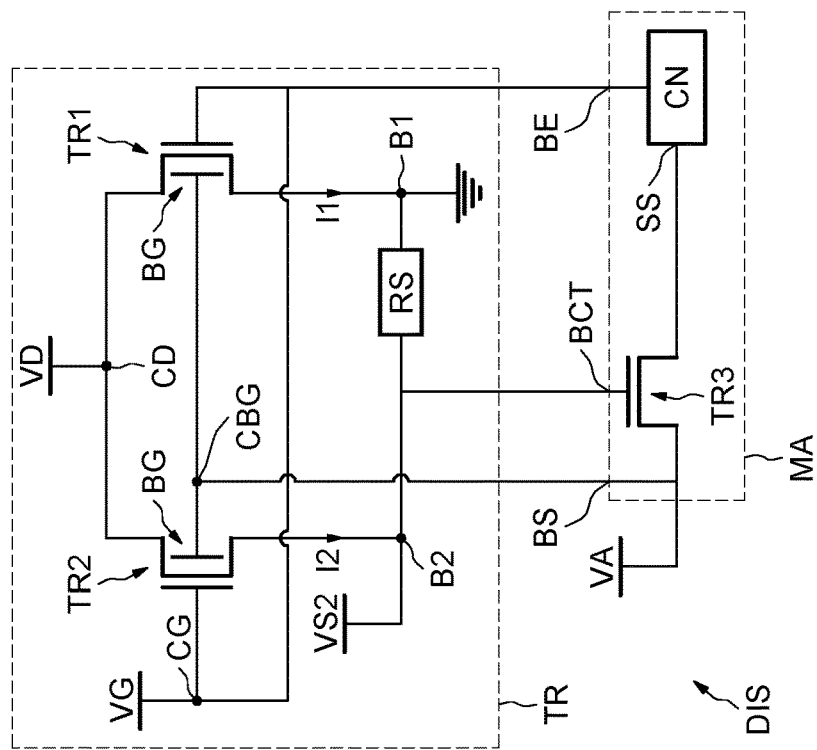
FIG. 2 is a schematic view of the electronic device of FIG. 1.
Figure 1:
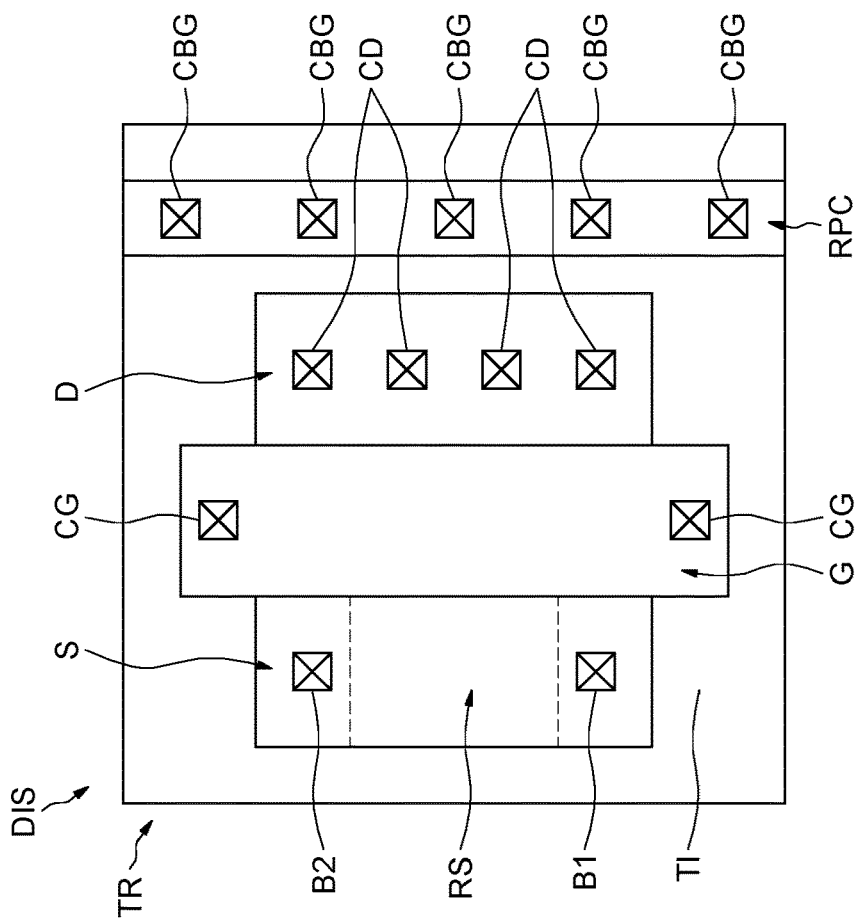
FIG. 1 is a top plan view of an electronic device in accordance with this disclosure.

FIGS. 1 and 2 illustrate an integrated electronic device DIS, of which FIG. 2 is a schematic view from an electrical point of view.

The electronic device DIS includes a transistor TR, for example a MOS transistor formed on a substrate of silicon-on-insulator (SOI) type, and adjustment circuitry MA that is not shown in FIG. 1 for the sake of simplicity.

The substrate is a semiconductor film positioned above a buried insulating layer (known to those skilled in the art under the term BOX ('Buried OXide')), which itself is situated above a carrier substrate, for example a semiconductor well.

The transistor TR includes a source semiconductor region S, a drain semiconductor region D, and a gate region G. The active zone of the transistor TR is isolated from the other components of the device by an isolating region TI, for example of a shallow trench isolation (STI) type.

Contacts are formed in various regions of the transistor TR, for example contacts made of tungsten. The zones of implantation of the contacts are silicided in this case.

For example, the device DIS in this case includes several drain contacts CD that are formed along the drain region D. The entire area of the drain region is silicided in this case, and the resistance between two separate drain contacts is therefore very low, close to zero.

The drain contacts CD are coupled to one another, for example via metal tracks of an interconnect part of the device.

Gate contacts CG are formed on either side of the gate region G, and since the entire area of the gate region is silicided in this case, the resistivity between the contacts that are situated on either side of the gate line is very low. This allows in particular uniform biasing of the gate region.

The gate contacts CG are also coupled to one another via metal tracks.

A well contact-making region RPC is formed within the isolating region TI, and makes it possible to bias the well of the transistor TR, which then behaves as a back gate for the transistor TR.

The well contact-making region RPC includes a plurality of well contacts CBG that are coupled to one another, and is silicided over its entire area.

The source region S includes two contacts forming a first terminal B1 and a second terminal B2 and that are formed at two locations of the source region, on either side of a non-silicided resistive portion RS of the source region.

The resistivity between the first terminal B1 and the second terminal B2 is thus greater, for example in this case of the order of 10 kΩ. The first terminal B1 and the second terminal B2 are not coupled electrically by metal tracks of the interconnect part, as is the case for the drain contacts CD, the gate contacts CG and the well contacts CBG.

As illustrated in FIG. 2, the transistor TR with its non-silicided portion RS may be shown functionally as two transistors TR1 and TR2 having their gates coupled to one another, their back gates BG coupled to one another and their drain regions coupled to one another, and their source regions coupled to one another by way of the resistor RS.

The first terminal B1 is in this case coupled to ground.

The transistor TR may be either in an off state, in this case when the voltage VG on its gate G, or control voltage, and the drain voltage VD are equal to 0 volts, or in an on state, in this case when the control voltage VG and the drain voltage VD are equal to 1 volt.

When the transistor TR is in an on state, a first current I1 flows through the first transistor TR1, between the drain D and the first terminal B1, that is to say from the drain D to ground.

Also, a second current I2 flows through the second transistor TR2, between the drain D and the second terminal B2, and then from the second terminal B2 to the first terminal B1, that is to say to ground through the resistor RS.

It should be noted in this case that the first current I1 and the second current I2 are used for the sake of simplicity; in practice, the distribution of the current varies gradually along the substrate of the transistor TR.

Thus, the voltage VS2 on the second terminal B2 depends on the value of the second current I2 and on the value of the resistor RS.

Also, since the resistor RS is a silicon portion, its value depends in particular on the temperature of the silicon, and increases therewith.

The voltage VS2 therefore depends on the temperature of the resistor RS, and is therefore representative of the temperature of the device DIS.

When the transistor TR is in its off state, a leakage current is able to flow between the drain D and the source S of the transistor TR. This phenomenon may prove to be particularly detrimental when the device has a high number of transistors. Specifically, multiplying the leakage currents, in addition to generating additional consumption of the device DIS, may lead to overheating of the device DIS through the Joule effect.

The value of the leakage currents within a transistor increases with the temperature.

Thus, by virtue of the leakage currents flowing through the second transistor TR2 and the resistor RS, it is possible to ascertain the temperature of the device DIS by reading the potential VS2 on the second terminal B2.

The adjustment circuitry MA includes an input terminal BE, coupled to the gate contacts CG of the transistor TR, an output terminal BS coupled to the well contact CBG, that is to say to the back gate of the transistor TR and able to deliver an adjustment voltage VA, and a control terminal BCT coupled to the second terminal B2 and able to receive the voltage VS2.

The adjustment circuitry MA is configured to deliver a voltage having a first state, in this case a positive state, when the control voltage VG on the input terminal BE has a first value, in this case 1 volt, that is to say when the transistor TR is in the on state. The adjustment circuitry MA is configured to deliver a voltage having a second state, in this case a negative state, when the control voltage VG on the input terminal BE has a second value, in this case 0 volts, that is to say when the transistor TR is in the off state.

The adjustment circuitry MA includes for example a level shifter CN including an input forming the input terminal BE of the adjustment circuitry MA, and an output terminal SS.

The level shifter CN is configured to transmit a high state, in this case a voltage of 1 volt, on its output terminal SS when it receives a high state, that is to say a positive voltage value, and to transmit a low state, for example a voltage of −1 volt, on its output terminal SS when it receives a zero state, that is to say a voltage whose value is equal to 0 volts, on the input terminal BE.

A third transistor TR3, for example in this case a MOS transistor, has a first terminal coupled to the output terminal SS of the level shifter, a second terminal coupled to the output terminal BS of the adjustment circuitry MA, that is to say to the back gate of the transistor TR, and its gate coupled to the control terminal BCT, that is to say to the second terminal B2.

Thus, when the transistor TR is in an on state, the input terminal BE receives a voltage of 1 volt, and the shifter delivers a voltage of 1 volt on its output SS.

Also, since the gate of the third transistor is coupled to the second terminal B2, the resistance in the on state of the third transistor is proportional to the voltage VS2 on the second terminal, and therefore to the temperature of the device DIS.

The adjustment circuitry is therefore in this case configured to deliver, on the output terminal BS, a positive voltage of between 0 and 1 volt, whose value depends on the voltage VS2 and therefore on the temperature of the device DIS.

The higher the temperature, the closer the voltage delivered by the adjustment circuitry MA will be to 1 volt, and the lower the temperature, the closer the voltage delivered by the adjustment circuitry is to 0 volts.

The adjustment voltage VA delivered by the adjustment circuitry MA on the back gate BG of the transistor TR therefore adjusts the value of the current flowing within the transistor, in particular the value of the second current I2 flowing within the second transistor TR2, and therefore makes it possible to compensate for the variations in the second current I2.

In other words, the decrease in the value of the second current I2 due to the increase in the temperature of the device DIS is compensated for by the biasing, with a positive voltage, of the back gate BG of the transistor, which tends to increase the value of the second current I2.

The normal, that is to say non-impacted, operating temperature range of the device DIS is thus advantageously increased.

By way of indication, it has been observed, in accordance with this embodiment and for a temperature range ranging from 173 to 473 degrees Kelvin, that the variation in the value of the current is less than 5%, whereas it is between 10 and 15% in conventional integrated circuits.

The first current I1 is also influenced by the biasing of the back gate, since the transistors TR1 and TR2 are on the same active silicon.

When the transistor TR is in the off state, the level shifter CN delivers a negative voltage on its output terminal SS, in this case a voltage of −1 volt.

Thus, in operation analogous to that described above, the higher the temperature of the device DIS, the more the adjustment circuitry will deliver a voltage close to −1 volt on the back gate BG, and the lower the temperature, the more the adjustment circuitry will deliver a voltage close to 0 volts.

Thus, the increase in the value of the leakage currents due to the increase in the temperature of the device DIS is compensated for by the biasing, by a negative voltage, of the back gate BG of the transistor.

By way of indication, it has been observed, in accordance with this embodiment and for a temperature range ranging from 173 to 473 degrees Kelvin, that the value of the leakage currents is able to be reduced by 75% in comparison with an integrated circuit from the prior art.

Figure 4:
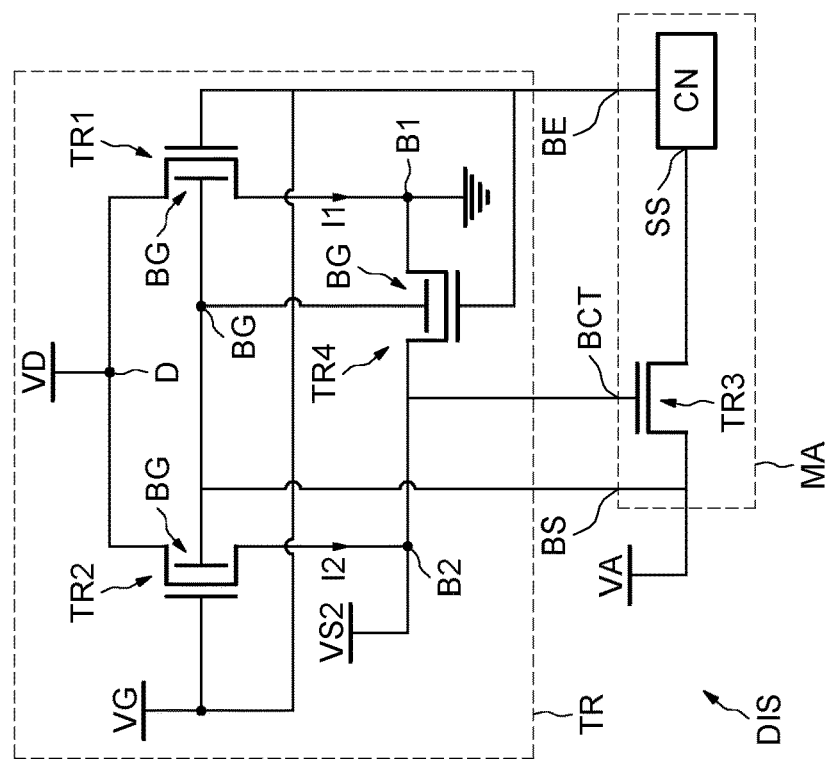
FIG. 4 is a schematic view of the electronic device of FIG. 3.
Figure 3:
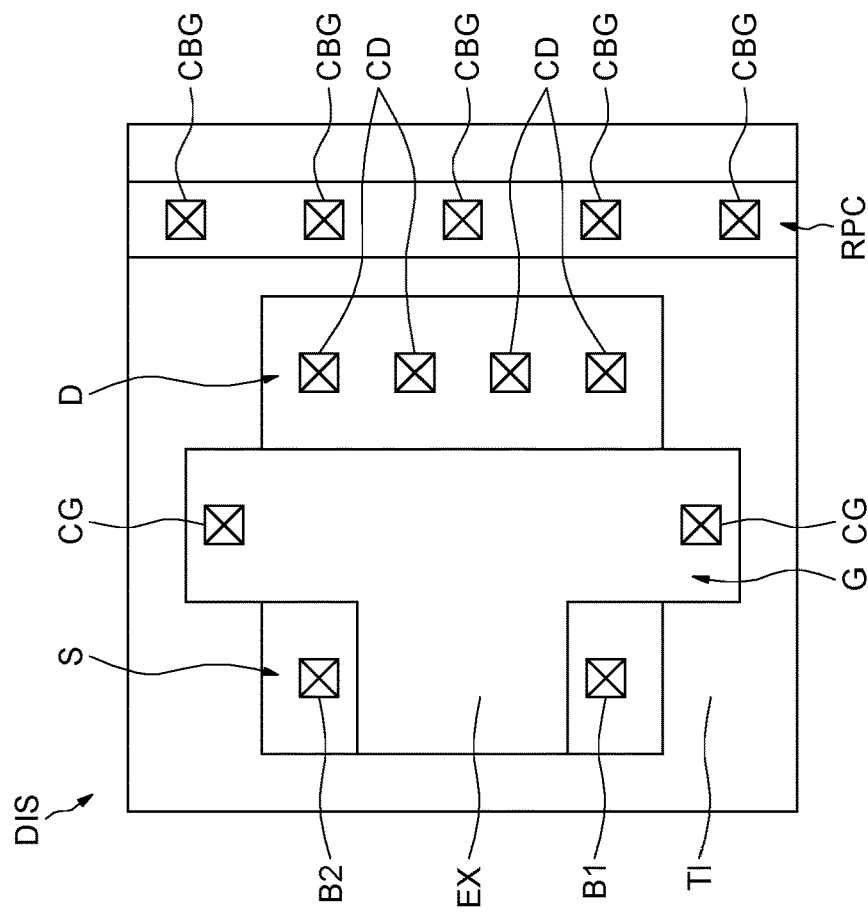
FIG. 3 is a top plan view of another embodiment of an electronic device in accordance with this disclosure.

FIGS. 3 and 4 illustrate an alternative embodiment of the device DIS, of which FIG. 4 is a schematic depiction from an electrical point of view.

In this embodiment, the non-silicided portion RS is coated with an extension EX of gate material that extends into the source region S from the gate region G, perpendicularly thereto. The extension EX is electrically isolated from the non-silicided portion RS by a dielectric material, such as a gate oxide.

Thus, as illustrated in FIG. 4, this embodiment corresponds electrically to substituting the resistor RS with a fourth transistor TR4.

The fourth transistor TR4 is coupled between the first terminal B1 and the second terminal B2, and has its gate coupled electrically to the gate G of the transistor TR and its back gate BG to the back gate of the transistor TR.

Thus, when the transistor TR is in operation, the fourth transistor TR4 is in the on state, and its back gate receives the adjustment voltage VA.

When the temperature of the device DIS increases, the resistivity in the on state of the fourth transistor TR4 tends to increase due to the increase in the temperature, on one hand, and to decrease due to the biasing of its back gate, on the other hand.

The value of the current I2 is therefore stabilized with even greater accuracy.

When the transistor TR is in the off state, the fourth transistor is also in the off state, and is equivalent to a very high-value resistor.

This suffices to greatly reduce the leakage currents within the device DIS when the transistor TR is in the off state, without however disrupting the operation of the transistor TR in the on state.

It should be noted that the position of the extension EX is not limited to that illustrated by FIG. 3. Specifically, it would be possible to form the extension EX closer to or further from the first terminal B1 or closer to or further from the second terminal B2, depending on whether it is desired to give preference to reducing the leakage currents or to stabilizing the second current I2.

The invention claimed is:

1. An integrated electronic device, comprising:
   a silicon-on-insulator substrate;
   at least one MOS transistor formed in and on said silicon-on-insulator substrate;
   wherein the at least one MOS transistor comprises:
      a gate region configured to receive a control voltage,
      a back gate configured to receive an adjustment voltage;
      a source or drain region having a resistive portion;
      a first terminal configured to be coupled to a first voltage and formed in the source or drain region and on a first side of the resistive portion of the source or drain region; and
      a second terminal configured to generate a voltage representative of a temperature of the integrated electronic device, the second terminal being formed in the source or drain region and on a second side of the resistive portion of the source or drain region; and
   adjustment circuitry configured to generate the adjustment voltage as having a value dependent on the control voltage and on the voltage generated by the second terminal.

2. The integrated electronic device according to claim 1, wherein the resistive portion is surmounted by a line of gate material, the line of gate material being electrically isolated from the resistive portion by a dielectric material and extending from the gate region while forming a continuity of material therewith, wherein resistance of the resistive portion varies as a function of biasing of the gate region and the back gate.

3. The integrated electronic device according to claim 2, wherein the line of gate material extends perpendicularly from the gate region.

4. The integrated electronic device according to claim 1, wherein the control voltage has a first value when the at least one MOS transistor is in an on state and has a second value when the at least one MOS transistor is in an off state; and wherein the adjustment circuitry is configured to generate the adjustment voltage as having a first state when the control voltage has the first value, and to generate the adjustment voltage as having a second state when the control voltage has the second value, and wherein the adjustment circuitry is further configured to adjust the adjustment voltage dependent on the voltage representative of the temperature of the integrated electronic device.

5. The integrated electronic device according to claim 1, wherein the adjustment circuitry includes a level shifter having an input and an output, the input being coupled to the gate region; further comprising a transistor coupled between the output of the level shifter and the back gate of the at least one MOS transistor, the transistor having a gate coupled to the second terminal; wherein the output of the level shifter is configured to generate a positive voltage if a voltage on the input of the level shifter is positive, and a negative voltage if the voltage on the input of the level shifter is zero.

6. The integrated electronic device according to claim 1, wherein the resistive portion has an upper surface which is non-silicided.

7. The integrated electronic device according to claim 1, wherein the first voltage is a reference voltage.

8. The integrated electronic device according to claim 1, wherein the source or drain region is a source region.

9. An electronic device, comprising:
a silicon-on-insulator substrate;
a pair of MOS transistors formed in and on said silicon-on-insulator substrate, wherein the pair of MOS transistors comprise:
   a shared source region divided into first and second source regions connected by a resistive portion of the shared source region;
   a shared drain region forming first and second connected drain regions;
   a shared back gate region forming first and second connected back gate regions receiving an adjustment voltage;
   a shared gate region forming first and second connected gate regions and receiving a control voltage;
   a first terminal configured to be coupled to a reference voltage and formed in the second source region; and
   a second terminal configured to generate a voltage representative of a temperature of the electronic device, the second terminal being formed in the first source region; and
adjustment circuitry configured to generate the adjustment voltage as having a value dependent on the control voltage and on the voltage generated by the second terminal.

10. The electronic device according to claim 9, wherein the resistive portion is surmounted by a line of gate material, the line of gate material being electrically isolated from the resistive portion by a dielectric material and extending from the shared gate region across the shared source region while forming a continuity of material therewith, wherein resistance of the resistive portion varies as a function of biasing of the shared gate region and the shared back gate region.

11. The electronic device according to claim 10, wherein the line of gate material extends perpendicularly from the shared gate region, across and bisecting the shared source region.

12. An electronic device, comprising:
a first transistor having a drain, a source coupled to a reference voltage, a gate coupled to a control voltage, and a back gate receiving an adjustment voltage;
a second transistor having a drain coupled to the drain of the first transistor, a source coupled to the source of the first transistor through a resistance, a gate coupled to the control voltage, and a back gate receiving the adjustment voltage;
a third transistor having a source generating the adjustment voltage, a drain, and a gate coupled to the source of the second transistor; and
a level shifter having an input coupled to the gates of the first and second transistors and an output coupled to the drain of the third transistor.

13. The electronic device of claim 12, wherein the level shifter is configured to generate a positive voltage at its output if a voltage at its input is positive, and a negative voltage at its output if the voltage at its input is zero.

14. The electronic device of claim 12, wherein the third transistor generates the adjustment voltage as having a first state when the first transistor is on and generates the adjustment voltage as having a second state when the first transistor is off.

15. The electronic device of claim 12, wherein the third transistor generates the adjustment voltage as a function of a source voltage of the second transistor.

16. An electronic device, comprising:
a first transistor having a drain, a source coupled to a reference voltage, a gate coupled to a control voltage, and a back gate receiving an adjustment voltage;
a second transistor having a drain coupled to the drain of the first transistor, a source, a gate coupled to the control voltage, and a back gate receiving the adjustment voltage;
a third transistor having a source generating the adjustment voltage, a drain, and a gate coupled to the source of the second transistor;
a fourth transistor having a drain coupled to the source of the second transistor, a source coupled to source of the first transistor, a gate coupled to the control voltage, and a back gate receiving the adjustment voltage; and
a level shifter having an input coupled to the gates of the first, second, and third transistors and an output coupled to the drain of the third transistor.

17. The electronic device of claim 16, wherein the level shifter is configured to generate a positive voltage at its output if a voltage at its input is positive, and a negative voltage at its output if the voltage at its input is zero.

18. The electronic device of claim 16, wherein the third transistor generates the adjustment voltage as having a first state when the first transistor is on and generates the adjustment voltage as having a second state when the first transistor is off.

19. The electronic device of claim 16, wherein the third transistor generates the adjustment voltage as a function of a source voltage of the second transistor.

* * * * *